United States Patent [19]
Bickel

[11] 3,953,702
[45] Apr. 27, 1976

[54] SOLID STATE MICROWAVE OVEN POWER SOURCE

[75] Inventor: Samuel H. Bickel, Garland, Tex.

[73] Assignee: Texas Instruments Incorporated, Dallas, Tex.

[22] Filed: Aug. 13, 1974

[21] Appl. No.: 497,152

[52] U.S. Cl. .............. 219/10.55 R; 219/10.55 F; 333/1.1
[51] Int. Cl.² .......................................... H05B 9/06
[58] Field of Search ............ 219/10.55 B, 10.55 F, 219/10.55 R; 333/1.1, 84; 343/792.5

[56] References Cited
UNITED STATES PATENTS

| | | | |
|---|---|---|---|
| 3,456,213 | 7/1969 | Hershenor | 333/84 X |
| 3,509,465 | 4/1970 | Andre et al. | 343/792.5 |
| 3,549,852 | 12/1970 | Scott | 219/10.55 R |
| 3,557,333 | 1/1971 | McAvoy | 219/10.55 R |
| 3,691,338 | 9/1972 | Chang | 219/10.55 R |

OTHER PUBLICATIONS

Yee, "N-Way TEM-Mode Broad Band Power Dividers," IEEE Trans On Microwave Theory & Techniques, Vol. MTT-18, No. 10, Oct. 1970.

Primary Examiner—Bruce A. Reynolds
Attorney, Agent, or Firm—Harold Levine; René E. Grossman; Alva H. Bandy

[57] ABSTRACT

Disclosed is a solid state power source for microwave ovens which combines the power from multiple solid state oscillators or amplifiers in phase into a single port or load. Amplifiers are driven in phase and drive the load in phase through an equal phase power combiner. Oscillators are phase locked through an equal phase power combiner to drive the single load in phase. In phase operation prevents absorption of power by the amplifiers or oscillators, increasing power delivered to the load and preventing damage to the individual amplifiers or oscillators.

6 Claims, 8 Drawing Figures

U.S. Patent   April 27, 1976   3,953,702
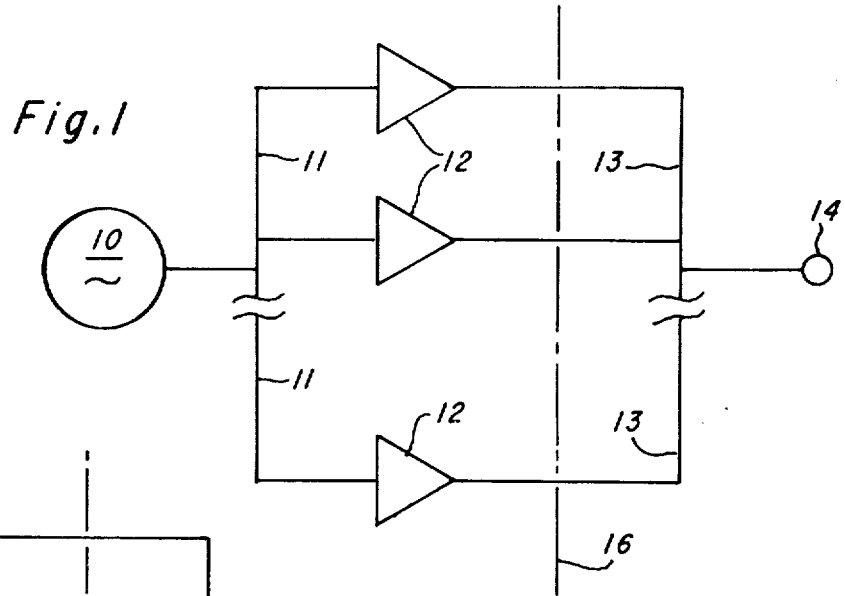
Fig. 1
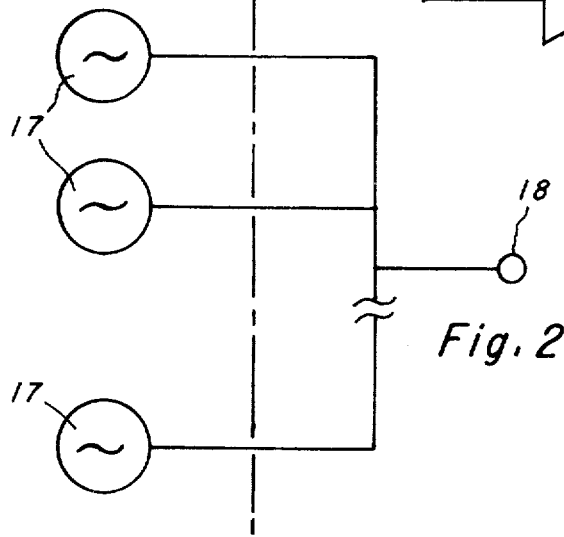
Fig. 2
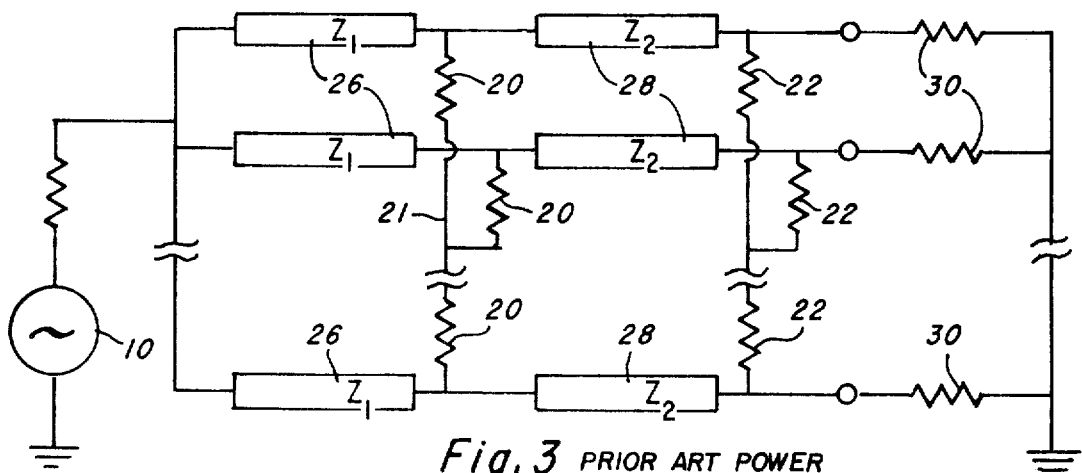
Fig. 3 PRIOR ART POWER DIVIDER

SOLID STATE MICROWAVE OVEN POWER SOURCE

This invention relates to microwave heating devices and more particularly to apparatus for combining the power from a plurality of solid state microwave generating devices into a common port.

The usefulness of microwave energy in thawing, heating and cooking foods and in heating other materials is widely recognized. Microwave ovens which are powered by means of a magnetron are in common use. Some of the problems encountered in magnetron powered microwave ovens are discussed in U.S. Pat. No. 3,691,338 issued to Chang on Sept. 12, 1972. Owing to the short lifetime of magnetrons and the non-uniform heating caused by the use of a single microwave power source the desirability of use of solid state microwave power sources has been recognized. The Chang patent and the McAvoy patent cited therein both represent attempts to solve these prior art problems by use of multiple solid state microwave sources.

A new problem is presented by use of multiple microwave power sources. The multiple sources must be coupled to the heating cavity by means of some type of antenna, which will also couple energy from the cavity back to the power source. If the power sources are not phase locked they will tend to absorb each other's generated power thereby reducing the amount of energy reaching the material in the oven and possibly destroying the individual sources. The loss of power is particularly undesirable when solid state power sources are used due to their low efficiency and low power output. The possible destruction of the solid state sources was recognized in the Chang patent with the use of a microstrip circulator stated as a solution. A circulator will protect the power sources from reflected energy damage but also will cause all reflected energy to be absorbed in a resistive load instead of the material in the cavity or oven and thus does not solve the loss of power problem. Circulators are also relatively expensive and difficult to produce.

Accordingly, it is an object of the present invention to provide an apparatus for maintaining a plurality of solid state microwave power sources in a phase locked condition and combining the power into a single load.

Another object is to provide a solid state microwave oven which is economical in construction and which lends itself to mass production techniques.

In accordance with this invention, a plurality of microwave amplifiers are driven in phase by a single oscillator and an impedance matching equal phase power divider. A similar power divider network is used in reverse to combine the multiple amplifier outputs in phase into a single port for driving a conventional antenna. Alternatively the outputs of multiple solid state oscillators may be combined in an equal phase power combiner which causes the oscillators to phase lock. Another embodiment of the invention uses multiple solid state oscillators coupled to a cylindrical resonant cavity so that each oscillator is phase locked to the resonant frequency thereby avoiding any absorption of power from the cavity by the oscillators.

Other objects, features, and advantages of this invention will become better understood by reference to the following detailed description when read in conjunction with the accompanying drawings wherein:

FIG. 1 is a block diagram of a set of microwave amplifiers being driven in phase by a single oscillator.

FIG. 2 is a block diagram of phase locked oscillators with coupled outputs.

FIG. 3 is a schematic diagram of an equal phase power divider.

Figure 4:
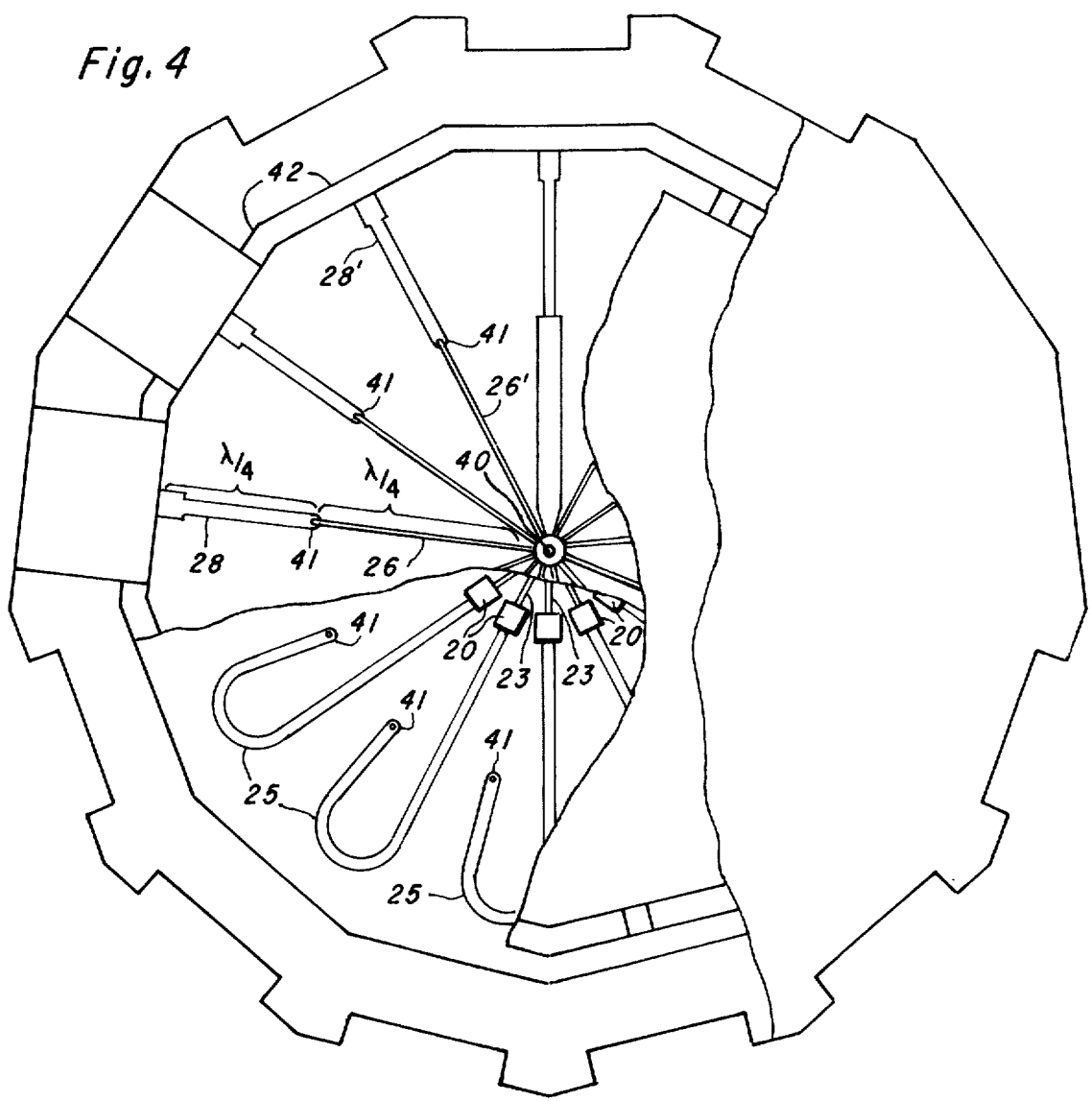
FIG. 4 illustrates a microstrip line embodiment of the power divider network of FIG. 3.

The operation and construction of solid state amplifiers and oscillators which may be used as power sources in the present invention is shown and discussed in an article entitled "Recent Advances in Solid State Microwave Generators", pp. 44–86 of Advances in Microwaves, Vol. 2, 1967, Academic Press, Inc., New York, to which reference may be had for a more detailed description.

FIG. 1 illustrates one embodiment for combining power from multiple microwave power sources into a single port. Power from a single oscillator 10 is divided by transmission lines 11 and fed to multiple amplifiers 12. The amplified signal is recombined by transmission lines 13 into a single output 14. To obtain maximum power output it is necessary to maintain the outputs of all amplifiers 12 in phase as indicated by line 16 which represents an equal phase surface. For any condition other than perfect phase matching the total power output is less than the theoretical maximum which is the power out of a single amplifier times the number of amplifiers.

As illustrated in FIG. 2, multiple oscillators 17 may be used as power sources with their power combined into a single output port 18. As with the amplifiers of FIG. 1, it is necessary that all the oscillators remain phase locked to achieve maximum power out.

To maintain the amplifiers 12 of FIG. 1 in phase locked condition, it is necessary to drive each amplifier with an equal phase signal. As in any high frequency system it is also necessary to impedance match the oscillator 10 output to the multiple amplifier 12 inputs. The equal phase power divider shown schematically in FIG. 3 both divides the oscillator power and matches the impedances. Such a power divider is discussed in Hung Yuet Yee, et al., "N-way TEM-Mode Broad-Band Power Dividers," IEEE Transactions on Microwave Theory and Techniques, MTT-18, No. 10, October 1970 to which reference may be had for a more detailed description. The transmission line segments 26 and 28 have impedances and lengths chosen to operate as impedance transformers to match the impedances of the amplifier inputs 30 to that of the oscillator output. This network forms the divider network shown as lines 11 in FIG. 1. If all the amplifier input impedances 30 are equal, the wave patterns on transmission line segments 26, 28 will be identical, that is, all signals on the lines will be even mode. Resistor networks 20, 22 are connected to the transmission lines at points equally spaced from the amplifier inputs. Since the even mode signal is equal at the resistor connections of each network there is no absorption of the signal. But if one of the amplifier inputs 30 becomes mismatched, it will cause reflections to occur on the respective transmission line, but not on the others. This odd mode signal will appear across the resistors and will be absorbed by them. Thus, it is seen that the resistor networks 20, 22 isolate the oscillator 10 and the other amplifier inputs 30 from any mismatch occurring at one of the amplifier inputs, which could occur, for example, when an amplifier becomes inoperative.

Just as the network of FIG. 3 is used to divide power from the oscillator to the amplifiers, it also may be operated in reverse to combine power from the amplifier outputs into a single port while maintaining constant phase conditions. It is used in reverse to form the power combiner network shown as lines 13 in FIG. 1.

FIG. 4 illustrates a stripline embodiment of the power divider network of FIG. 3 formed on double sided metal clad 1/32 inch thick polytetrafluorethylene resin coated fiberglass boards. Like numbers will be used to designate like parts shown schematically in FIG. 3. A suitable resin is that sold under the trademark "Teflon" by E. I. Du Pont de Nemours and Company. Each board has a diameter of one wavelength at a preselected resonant energy frequency. FIG. 4 shows the two quarter wavelength transmission line segments 26, 28 having preselected widths coupled in series on one side of the board and a conductive layer (ground plane) on the opposite side which coact to form a microwave impedance transformer. Twelve of these transmission line segments are formed in a radial pattern as shown to divide power from the center 40 to the perimeter 42 of the circular pattern. A second identical transformer pattern is likewise used in reverse to combine power from twelve outputs feeding into ports on the perimeter into the single center port 40.

The isolation resistors 20 shown in FIG. 3 are formed on the reverse side of the microstrip circuit of FIG. 4. The resistors 20 are placed on a circular microstrip board like that on which the impedance transformers are formed. The two boards are placed back to back, that is with ground planes in contact. Feedthroughs are provided at the junctions 41 of the two quarter wave sections of the impedance transformers to allow the connections to the isolation resistor network.

The resistors 20 (FIGS. 3 and 4) should be physically close to the common junction 21 and also close to the impedance transformer feedthrough 41. The resistors may be placed in the center of the board in a circle as shown in FIG. 4. The connection to the impedance transformer is then made through half wavelength sections of stripline 25, which place the resistors electrically close to the center 41 of the impedance transformers. The common resistor junction is made through lines 23. As the number of resistors 20 increases, the distance from the common junction increases due to the finite size of chip resistors 20. The lines 23 add capacitance to the common junction 21 and cause dissipation of even mode energy.

The resistors 20 may be placed near the feedthroughs 41 shown in FIG. 4. The half wavelength line 25 is then used to connect the resistors to the common junction 21. By thus transposing the positions of the resistors and the half wavelength lines the connecting lines 23 are eliminated and the resistors are positioned in a larger circle where more area is available.

Figure 5:
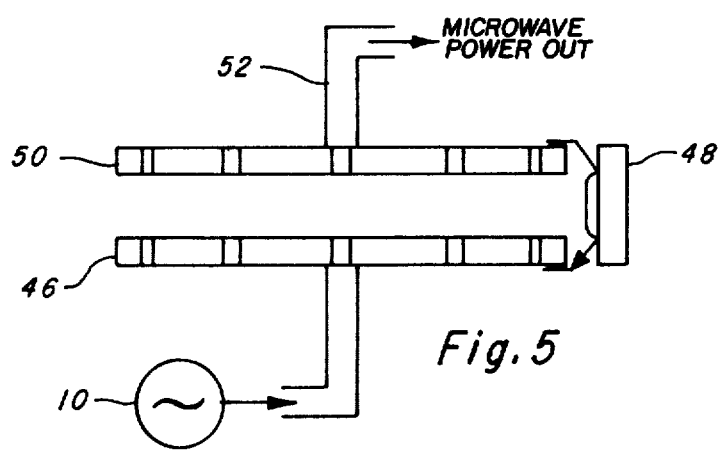
FIG. 5 is a pictorial view of a completed microwave power source in accordance with a preferred embodiment.

FIG. 5 shows a complete microwave power source comprising two of the power divider boards of FIG. 4. The oscillator 10 feeds power to the center of power divider 46 which drives multiple amplifiers 48, of which only one is shown. Each amplifier 48 is a solid state amplifier having its emitter coupled to the power divider 46 output port and its collector coupled to the power combiner 50 input port. The amplifier outputs are fed into the power combiner 50 and combined into the single port 52.

Figure 6:
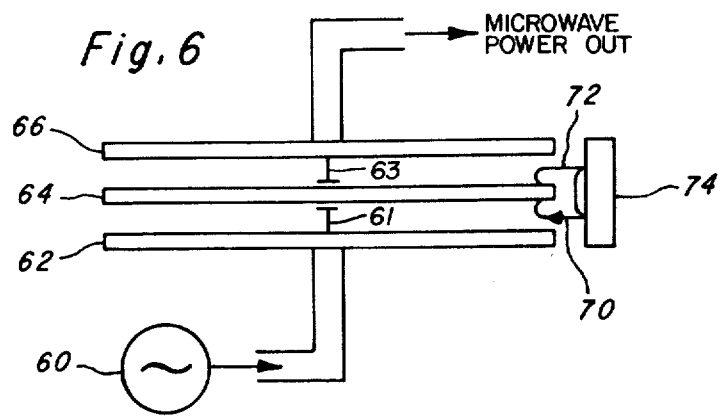
FIG. 6 is a pictorial view of an embodiment of the present invention employing a radial power divider.

FIG. 6 illustrates another microwave power source similar to that of FIG. 5 in operation but utilizing a different form of power divider/combiner. In this case the power from oscillator 60 feeds power through probe 61 into the center of a disc shaped waveguide formed of circular conductive plates 62 and 64 which may be, for example, metal plates. Due to symmetry the energy travels radially toward the circumference of the disc and arrives with equal phase at all points on the circumference. A plurality of antennas 70 receive the microwave energy. The antennas are coupled to a corresponding plurality of amplifiers, i.e., for example, they are coupled to the emitters of solid state microwave amplifiers. The collectors of amplifier 74 are coupled to drive similar loops 72 along the circumference of a second disc shaped waveguide formed of plates 64 and 66. The antennas 70 and 72 are H field coupling for coupling electromagnetic energy in and out of the amplifier. Being in phase, the outputs form a constant phase surface which travels to probe 63 of the output port located at the center of this second waveguide.

Electrically symmetric power combiners such as the stripline or radial waveguide combiners described above provide a coherent phase front of signal traveling from input to output. If the outputs of multiple oscillators are coupled to the inputs of a combiner of this type an injection locking mechanism phase locks the oscillators at a single frequency. Being phase locked the oscillators will not absorb the power generated by each other and the power coupled to the combiner output will be the sum of the outputs of all the oscillators. This phase locking mechanism attends a free running oscillator having a high power output coupled to a stable low power signal; by the injection of the low power signal into the high power signal, the high power frequency locks onto the low power frequency. This phase locking mechanism is analyzed by Kaneyuki Kurokawa in "The Single-Cavity Multiple-Device Oscillator" published in the IEEE Transactions on Microwave Theory and Techniques, MTT-19, No. 10, October 1971, to which reference may be had for a more detailed description. When the above described stripline combiner is used the isolation resistor networks 20, 22, and 30 (FIG. 1) are removed to prevent multiple oscillation modes. One skilled in the art will recognize that the waveguide formed by metal plates 64 and 66 conveys the microwave power or energy in the same manner as an oven cavity. Thus, the waveguide formed by plates 64 and 66 can form an oven cavity.

Figure 7:
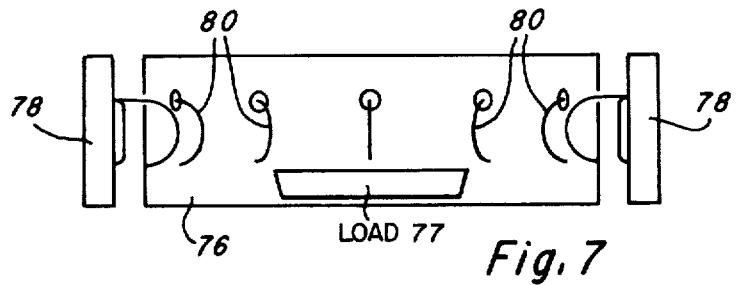
FIG. 7 is a pictorial view of an embodiment of the present invention employing a resonant cylindrical cavity.

FIG. 7 shows as another embodiment of the present invention the feature that the waveguide forming plates 64 and 66 of FIG. 6 form a resonant cavity 76. A cylindrical resonator as illustrated (FIG. 7) has a maximum electric field at the center decaying to zero at the conducting side walls. For a cylindrical cavity to resonate the radius according to the teachings of Ramo and Whinnery, *FIELDS AND WAVES IN MODERN RADIO*, Section 10-08, P 429 must be equal to the wavelength at the desired frequency divided by 2.61. The oscillators 78 are solid state microwave oscillators positioned on the cylindrical surface where the magnetic field is maximum and coupled to the resonant field by magnetic coupling loops or antennas 80. Under these conditions the cavity 76 forms the cooking compartment which acts like the symmetrical power combiners described above and the oscillators all phase lock to the resonant mode of cavity oscillations. The oscillators 78 each couple power into the cavity 76 with substantially no absorption of power from the cavity. The load 77 to be heated is placed directly in the cavity 76. To maintain optimum phase locked conditions, the load is centered in the cavity to load each oscillator equally. The advantage of this embodiment is the elimination of a power combiner and its cost.

Figure 8:
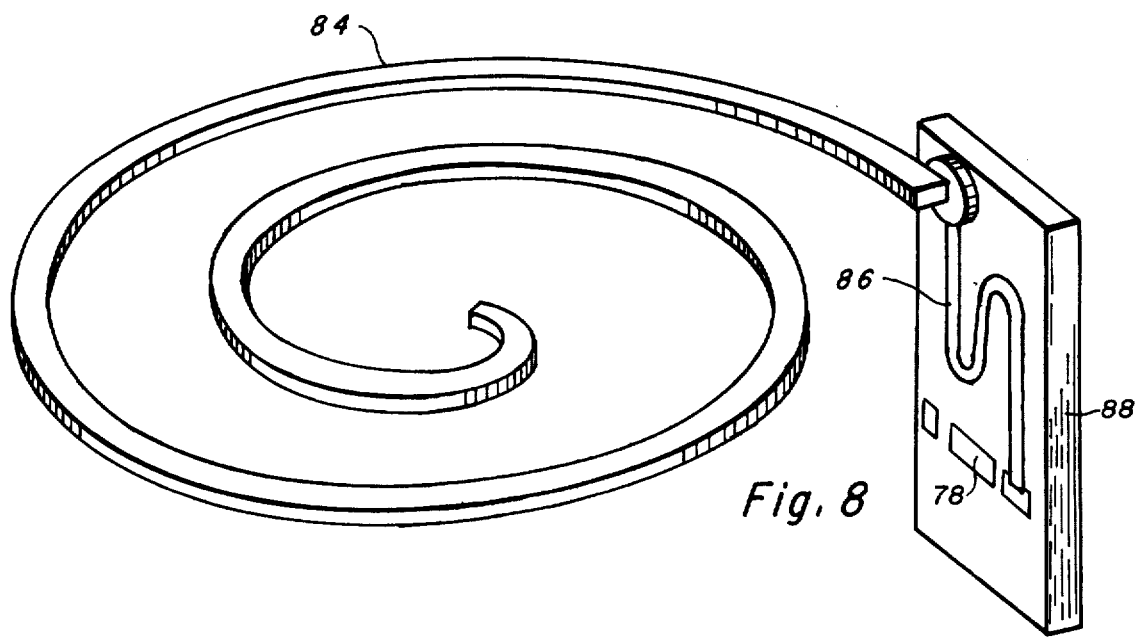
FIG. 8 is a pictorial view of a multiple arm spiral antenna for use in the embodiment of FIG. 7.

FIG. 8 illustrates one element of a multiple arm spiral antenna which in another embodiment of FIG. 7 is used in place of the magnetic coupling loops or antennas 80 of FIG. 7 to insure even loading of the individual power sources regardless of load placement. Each antenna has one arm 84 per source and distributes the coupling over the entire cavity. Thus a load may be placed at any point in the cavity and will draw essentially the same power from each source, avoiding possible loss of phase locked condition.

When solid state amplifiers 78 are used as power sources for the cavity of FIG. 7, an equal phase power divider as described above (FIG. 3) is used to divide power from a single oscillator and provide an equal phase signal to each amplifier input. But if the spiral antenna (FIG. 8) is used to radiate energy into the cavity, its inputs have a specific phase relationship in order to excite a particular field mode on the antenna. A first mode of radiation from a spiral antenna is achieved by having the input signals phase shifted electrically according to the angular position of the input on the circumference of the antenna. Thus, if the antenna has 16 elements, each element will be spaced 22.5° apart on the circumference and each input signal must lag 22.5° behind the previous input if measured sequentially around the antenna in one direction. The phase shifting can be accomplished by building the proper length sections of stripline 86 into each amplifier module 88 (FIG. 8).

If solid state oscillators are used to supply power to the resonant cavity (FIG. 7) through a spiral antenna (FIG. 8), each will phase lock to the cavity as its proper phase angle. Thus it can be seen that the oscillators phase lock to the resonant cavity oscillations and not actually to a common phase. This is required by the fact that the spiral antenna would not radiate and thus could not couple energy to the cavity if all inputs were in phase. It is the coupling of each oscillator to the standing wave pattern of the cavity which causes the injection locking mechanism and keeps the oscillator in phase.

Many combinations of the above elements may be made within the scope of the present invention. For example, the stripline power divider and multiple amplifiers may be used to drive a resonant cavity by means of probes on the cavity circumference. It will be apparent that other changes or modifications can be made without departing from the spirit and scope of the invention as defined by the appended claims.

What is claimed is:
1. A solid state microwave power source comprising:
 a. a microwave power producing means;
 b. an equal phase microwave power divider coupled to the microwave power producing means for dividing equally the microwave power and matching the impedance of the microwave power producing means to the impedances of a plurality of solid state microwave amplifiers, said equal phase microwave power divider having a plurality of output ports;
 c. a plurality of solid state microwave amplifiers coupled to the output ports of the equal phase microwave power divider for amplifying the microwave power; and
 d. an equal phase power combiner connected to the plurality of solid state microwave amplifiers for combining the amplified microwave power output into a source of amplified microwave power, whereby a low microwave power source may be amplified into a substantially higher microwave power source.

2. A microwave power source according to claim 1 wherein the equal phase power divider comprises: a disc of dielectric material having a diameter of one wavelength at a preselected microwave frequency, a conductive layer forming a ground plane bonded to and covering one side of the disc and a conductive pattern on the other side of the disc said conductive pattern comprising an input pad at the center of the disc, and a plurality of conductive strips extending from the center pad radially to the edge of the disc, each strip having a first preselected width over a first portion of its length and a second preselected width over a second portion of its length for forming with the ground plane a microwave impedance matching transformer.

3. A solid state microwave power source comprising:
 a. a source of microwave energy;
 b. a pair of spaced disc shaped conductor plates forming a first disc shaped waveguide;
 c. an antenna centrally disposed within the first disc shaped waveguide, said antenna coupled to the source of microwave energy for transmitting the microwave energy through the waveguide;
 d. a first plurality of antennas positioned adjacent the circumference of the first disc shaped waveguide for receiving microwave energy arriving with equal phase at the circumference of the first disc shaped waveguide;
 e. a plurality of solid state microwave power amplifiers coupled to the first plurality of antennas for amplifying the microwave energy;
 f. a third disc shaped conductor coacting with one of the pair of spaced disc shaped conductors to form a second disc shaped waveguide; and
 g. a second plurality of antennas coupled to the plurality of solid state amplifiers, said second plurality of antennas positioned in the second disc shaped waveguide adjacent its circumference for transmitting the amplified microwave power energy to the center of the second disc shaped waveguide.

4. A solid state microwave power source according to claim 3, further including an antenna centrally disposed within the second disc shaped waveguide for receiving the microwave energy transmitted in the second disc shaped waveguide by the second plurality of antennas, and an output power port coupled to said antenna for providing a combined power output for the amplified microwave power.

5. A solid state microwave power source according to claim 3 wherein said second disc shaped waveguide forms a cavity for a microwave oven.

6. A solid state microwave power divider according to claim 3 wherein the said second plurality of antennas are spiral antenna elements.

* * * * *